(12) United States Patent
Yamazaki et al.

(10) Patent No.: US 8,377,799 B2
(45) Date of Patent: Feb. 19, 2013

(54) METHOD OF MANUFACTURING SOI SUBSTRATE

(75) Inventors: Shunpei Yamazaki, Tokyo (JP); Toru Takayama, Kanagawa (JP); Mizuho Sato, Kanagawa (JP); Noriaki Uto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 13/070,512

(22) Filed: Mar. 24, 2011

(65) Prior Publication Data

US 2011/0244652 A1    Oct. 6, 2011

(30) Foreign Application Priority Data

Mar. 31, 2010   (JP) ................................. 2010-084278

(51) Int. Cl.
*H01L 21/30* (2006.01)

(52) U.S. Cl. ........ 438/458; 438/459; 438/455; 438/526; 438/795; 257/E21.211; 257/E21.317; 257/E21.319

(58) Field of Classification Search .................. 438/458, 438/459, 455, 526, 795; 257/E21.211, E21.317, 257/E21.319
See application file for complete search history.

(56) References Cited

U.S. PATENT DOCUMENTS

| | | | |
|---|---|---|---|
| 5,374,564 A | 12/1994 | Bruel | |
| 5,966,620 A * | 10/1999 | Sakaguchi et al. | 438/455 |
| 6,468,923 B1 | 10/2002 | Yonehara et al. | |
| 2009/0075456 A1 | 3/2009 | Akimoto et al. | |
| 2009/0170287 A1 | 7/2009 | Endo et al. | |

FOREIGN PATENT DOCUMENTS

| | | |
|---|---|---|
| JP | 05-211128 | 8/1993 |
| JP | 2000-349266 | 12/2000 |

* cited by examiner

*Primary Examiner* — Thinh T Nguyen
(74) *Attorney, Agent, or Firm* — Eric J. Robinson; Robinson Intellectual Property Law Office, P.C.

(57) ABSTRACT

An object of the present invention is to provide an SOI substrate including a semiconductor layer which is efficiently planarized. A method for manufacturing an SOI substrate includes a step of irradiating a bond substrate with an accelerated ion to form an embrittlement region; a step of bonding the bond substrate and the base substrate with an insulating layer positioned therebetween; a step of splitting the bond substrate at the embrittlement region to leave a semiconductor layer bonded to the base substrate; a step of disposing the semiconductor layer in front of a semiconductor target containing the same semiconductor material as the semiconductor layer; and a step of alternately irradiating the surface of the semiconductor layer and the semiconductor target with a rare gas ion, so that the surface of the semiconductor layer is planarized.

16 Claims, 10 Drawing Sheets

Reprocessing step

Reprocessing step

METHOD OF MANUFACTURING SOI SUBSTRATE

BACKGROUND OF THE INVENTION

1. Field of the Invention

The present invention relates to a method for manufacturing a substrate over which a semiconductor layer is provided with an insulating layer positioned therebetween, and particularly relates to a method for manufacturing a silicon on insulator (SOI) substrate. Further, the present invention relates to a method for recycling a bond substrate in the manufacturing method of an SOI substrate.

2. Description of the Related Art

As substrates suitable for manufacture of semiconductor devices that achieve low power consumption and high-speed operation, attention has been directed to SOI substrates in which a semiconductor layer is provided over a base substrate having an insulating surface.

One of known methods for manufacturing an SOI substrate is a hydrogen ion implantation separation method (see Patent Document 1). The hydrogen ion implantation separation method is a technique of forming an SOI substrate in the following manner. An oxide film is formed on one of two silicon wafers which is to serve as a bond substrate, and by implanting hydrogen ions into the bond substrate, a microbubble layer is formed in the bond substrate. The bond substrate is put in close contact with the other silicon wafer that is to serve as a base substrate, with the oxide film positioned therebetween. Then, by a heat treatment, the bond substrate is split with the use of the microbubble layer as a splitting plane. Another heat treatment on the base substrate side forms a strong bond between the base substrate and a semiconductor layer that is separated from the bond substrate. Thus, an SOI substrate is formed.

Furthermore, for an efficient and economical use of silicon wafers, a method by which many SOI substrates can be manufactured with as few silicon wafers as possible has been researched (see Patent Document 2).

REFERENCE

Patent Document

[Patent Document 1] Japanese Published Patent Application No. H5-211128
[Patent Document 2] Japanese Published Patent Application No. 2000-349266

SUMMARY OF THE INVENTION

In the case of utilizing the hydrogen ion implantation separation method, the volume of a microbubble layer formed in a silicon wafer is changed by a heat treatment and a split occurs at the microbubble layer, so that an SOI substrate can be obtained. However, the semiconductor layer of the SOI substrate after the split has a rough surface due to the microbubble layer, and thus needs to be subjected to a planarization treatment. A chemical mechanical polishing (CMP) treatment can be employed to planarize the surface of the semiconductor layer (or the silicon wafer after the split). However, in a CMP treatment, the amount of polishing of the semiconductor layer (or the silicon wafer) tends to be large and therefore productivity is prevented from improving and the manufacturing cost is prevented from reducing.

In view of the above problem, an object of an embodiment of the present invention is to manufacture an SOI substrate in which a surface of a semiconductor layer is efficiently planarized. Further, an object of the present invention is to provide a semiconductor device using the SOI substrate. Further, an object of an embodiment of the present invention is to efficiently reprocess a bond substrate.

An embodiment of the present invention is a method for manufacturing an SOI substrate including the following steps: a step of irradiating a bond substrate with an accelerated ion, so that an embrittlement region is formed in the bond substrate; a step of forming an insulating layer over a surface of the bond substrate or a surface of a base substrate; a step of bonding the bond substrate and the base substrate with the insulating layer positioned therebetween; a step of splitting the bond substrate at the embrittlement region by a heat treatment, so that a semiconductor layer is formed over the base substrate; a step of disposing the semiconductor layer provided over the base substrate and a semiconductor target containing the same semiconductor material as the semiconductor layer so that a surface of the semiconductor layer provided over the base substrate and the semiconductor target face each other; and a step of alternately irradiating the surface of the semiconductor layer and the semiconductor target with a rare gas ion, so that the surface of the semiconductor layer is planarized.

The above-described semiconductor target may be a bond substrate after a split.

An embodiment of the present invention is a method for manufacturing an SOI substrate including the following steps: a step of irradiating a bond substrate with an accelerated ion, so that an embrittlement region is formed in the bond substrate; a step of forming an insulating layer over a surface of the bond substrate or a surface of a base substrate; a step of bonding the bond substrate and the base substrate with the insulating layer positioned therebetween; a step of splitting the bond substrate at the embrittlement region by a heat treatment, so that a semiconductor layer is formed over the base substrate; a step of disposing the semiconductor layer provided over the base substrate and a semiconductor layer provided over another base substrate of the same structure so that a surface of the semiconductor layer provided over the base substrate and a surface of the semiconductor layer provided over the other base substrate face each other; and a step of alternately irradiating the surface of the semiconductor layer and the surface of the semiconductor layer provided over the another base substrate with a rare gas ion, so that the surfaces of the semiconductor layer are planarized.

Further, an embodiment of the present invention is a method for reprocessing a bond substrate including the following steps: a step of irradiating a bond substrate with an accelerated ion, so that an embrittlement region is formed in the bond substrate; a step of forming an insulating layer over a surface of the bond substrate or a surface of a base substrate; a step of bonding the bond substrate and the base substrate with the insulating layer positioned therebetween; a step of splitting the bond substrate at the embrittlement region by a heat treatment, so that a semiconductor layer is formed over the base substrate; a step of disposing the bond substrate after the split and a semiconductor target containing the same semiconductor material as the bond substrate so that a surface of the bond substrate after the split and the semiconductor target face each other; and a step of alternately irradiating the surface of the bond substrate and the semiconductor target with a rare gas ion, so that the surface of the bond substrate is planarized.

Note that in this specification and the like, the term "SOI substrate" is used to also refer to a substrate provided with a layer of a semiconductor other than silicon with an insulating layer positioned therebetween. In other words, in this specification and the like, a bond substrate used for manufacture of an SOI substrate may be a substrate other than a substrate containing a silicon material.

According to an embodiment of the present invention, an SOI substrate in which a surface of a semiconductor layer is efficiently planarized can be provided. Further, a semiconductor device using the SOI substrate can be provided. Further, a bond substrate can be efficiently reprocessed.

BRIEF DESCRIPTION OF THE DRAWINGS

In the accompanying drawings:

FIG. 2 is a cross-sectional view of a sputtering apparatus;

FIGS. 3A-1, 3A-2, 3B-1 to 3B-3, 3C, 3D, and 3E are cross-sectional views illustrating an example of a method for manufacturing an SOI substrate;

DETAILED DESCRIPTION OF THE INVENTION

Figure 1A:
FIGS. 1A, 1B-1 to 1B-3, 1C, 1D, and 1E are cross-sectional views illustrating an example of a method for manufacturing an SOI substrate.

Hereinafter, embodiments are detailed using the accompanying drawings. Note that the invention is not limited to the description below, and it will be apparent to those skilled in the art that the embodiments and details thereof can be easily modified in various ways without departing from the spirit of the invention disclosed in this specification and the like. In addition, structures according to different embodiments can be implemented in appropriate combination. Note that throughout the structures of the invention described below, identical parts or parts having similar functions are represented by the same reference numeral, the explanation of which is not repeated.

Note that the position, the size, the range, or the like of each structure illustrated in drawings and the like is not accurately represented in some cases for easy understanding. Therefore, the disclosed invention is not necessarily limited to the position, size, range, or the like which is disclosed in the drawings and the like.

Embodiment 1

In this embodiment, an example of a method for manufacturing an SOI substrate is described with reference to FIGS. 1A, 1B-1 to 1B-3, 1C, 1D, and 1E and FIG. 2.

First, a base substrate 100 is prepared (see FIG. 1A). As the base substrate 100, it is possible to use a light-transmitting glass substrate used for a liquid crystal display device or the like. As the glass substrate, a substrate having a strain point of 580° C. or higher (preferably 600° C. or higher) may preferably be used. Further, the glass substrate is preferably a non-alkali glass substrate. The non-alkali glass substrate is formed using a glass material such as aluminosilicate glass, aluminoborosilicate glass, or barium borosilicate glass, for instance.

Note that as the base substrate 100, it is possible to use an insulating substrate such as a ceramic substrate, a quartz substrate, or a sapphire substrate, a substrate formed of a semiconductor such as silicon, a substrate formed of a conductor such as metal or stainless steel, or the like, as well as the glass substrate.

Figures 1, 1B:

Next, a bond substrate 110 is prepared (see FIG. 1B-1). As the bond substrate 110, for example, a single crystal semiconductor substrate formed of a Group 14 element such as silicon, germanium, silicon germanium, or silicon carbide can be used.

Although there is no limitation on the size of the bond substrate 110, for example, a semiconductor substrate that is 8 inches (200 mm) in diameter, 12 inches (300 mm) in diameter, or 18 inches (450 mm) in diameter can be used. Alternatively, a round semiconductor substrate processed into a rectangular shape may be used.

Figures 1, 1B, 2:
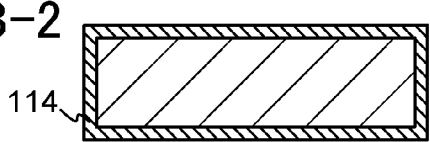

Next, an insulating layer 114 is formed on the bond substrate 110 (see FIG. 1B-2).

As the insulating layer 114, for instance, a silicon oxide film, a silicon oxynitride film, a silicon nitride film, a silicon nitride oxide film, or the like can be used. These films can be formed by a thermal oxidation method, a CVD method, a sputtering method, or the like. When a CVD method is employed to form the insulating layer 114, use of a silicon oxide film formed using organosilane, such as tetraethoxysilane (abbreviation: TEOS) (chemical formula: $Si(OC_2H_5)_4$), as the insulating layer 114 is preferable in terms of productivity.

In this embodiment, by subjecting the bond substrate 110 to a thermal oxidation treatment, the insulating layer 114 (here, a silicon oxide film) is formed. The thermal oxidation treatment is preferably performed in an oxidizing atmosphere to which halogen is added. For example, the bond substrate 110 is subjected to the thermal oxidation treatment in an oxidizing atmosphere to which chlorine (Cl) is added, so that the insulating layer 114 oxidized with HCl is formed. Accordingly, the insulating layer 114 includes chlorine atoms.

Note that although the insulating layer 114 has a single-layer structure in this embodiment, it may have a stacked-layer structure. A structure in which the insulating layer 114 is not provided may be employed as long as a problem does not particularly occur in bonding.

Next, the bond substrate 110 is irradiated with ions, so that an embrittlement region 112 is formed (see FIG. 1B-3). More specifically, for example, an ion beam including ions accelerated by an electric field is delivered to form the embrittlement region 112 at a certain depth from a surface of the bond substrate 110. Accelerating energy of the ion beam or the incidence angle thereof controls the depth at which the embrittlement region 112 is formed. In other words, the embrittlement region 112 is formed in a region at a depth the same or substantially the same as the average penetration depth of the ions. Here, the depth at which the embrittlement region 112 is formed is preferably uniform in the entire surface of the bond substrate 110.

Further, the depth at which the above-described embrittlement region 112 is formed determines the thickness of the semiconductor layer which is to be separated from the bond substrate 110. The depth at which the embrittlement region 112 is formed is greater than or equal to 50 nm and less than or equal to 1 µm, preferably greater than or equal to 50 nm and less than or equal to 300 nm, from the surface of the bond substrate 110.

When ions are added to the bond substrate 110, an ion implantation apparatus or an ion doping apparatus can be used. With an ion implantation apparatus, a source gas is excited to generate ion species, the generated ion species are mass-separated, and the object to be processed is irradiated with the ion species having a certain mass. With an ion doping apparatus, a process gas is excited to generate ion species, and the object to be processed is irradiated with the generated ion species that are not mass-separated. Note that in an ion doping apparatus provided with a mass separator, ion irradiation involving mass separation can also be performed as in the ion implantation apparatus.

When an ion doping apparatus is used, a process of forming the embrittlement region 112 can be performed, for example, under the following conditions:

Accelerating voltage: higher than or equal to 10 kV and lower than or equal to 100 kV (preferably higher than or equal to 30 kV and lower than or equal to 80 kV)

Dose: greater than or equal to $1\times10^{16}$/cm$^2$ and less than or equal to $4\times10^{16}$/cm$^2$ Beam current density: greater than or equal to 2 µA/cm$^2$ (preferably greater than or equal to 5 µA/cm$^2$, more preferably greater than or equal to 10 µA/cm$^2$)

When an ion doping apparatus is used, a gas containing hydrogen can be used as the source gas. By using a gas containing hydrogen, $H^+$, $H_2^+$, and $H_3^+$ can be generated as ion species. When a hydrogen gas is used as the source gas, it is preferable to perform irradiation with a large amount of $H_3^+$ ions. Specifically, in an ion beam, the proportion of $H_3^+$ ions in the total of $H^+$, $H_2^+$, and $H_3^+$ ions is preferably 70% or more. More preferably, the proportion of $H_3^+$ ions is 80% or more. By increasing the proportion of $H_3^+$ ions in this manner, the embrittlement region 112 can contain hydrogen at a concentration of $1\times10^{20}$ atoms/cm$^3$ or higher. This facilitates a split at the embrittlement region 112. Furthermore, by irradiation with a large number of $H_3^+$ ions, the embrittlement region 112 can be formed in a shorter period of time as compared with the case of irradiation with $H^+$ ions and $H_2^+$ ions. Moreover, the use of $H_3^+$ ions can reduce the average penetration depth of ions; thus, the embrittlement region 112 can be formed in a shallow region.

When an ion implantation apparatus is used, preferably, irradiation with $H_3^+$ ions is performed by mass separation. It is needless to say that irradiation with $H^+$ or $H_2^+$ ions may be performed. Note that since the use of an ion implantation apparatus involves selection of ion species to perform irradiation, ion irradiation efficiency could be decreased compared to the case where an ion doping apparatus is used.

As the source gas for the ion irradiation step, as well as a gas containing hydrogen, it is possible to use one or more kinds of gases selected from a rare gas of helium, argon, or the like, a halogen gas typified by a fluorine gas or a chlorine gas, and a halogen compound gas such as a fluorine compound gas (e.g., $BF_3$). When helium is used for the source gas, an ion beam having a high proportion of $He^+$ ions can be produced without mass separation. Use of such an ion beam can realize efficient formation of the embrittlement region 112.

Further, the embrittlement region 112 can be formed through ion irradiation divided into plural steps. In this case, a different source gas may be used in each ion irradiation, or the same source gas may be used. For example, after ion irradiation is performed using a rare gas as a source gas, further ion irradiation can be performed using a gas containing hydrogen as a source gas. Also, ion irradiation is performed first using a halogen gas or a halogen compound gas, and then ion irradiation can be performed using a gas containing hydrogen.

Figures 1, 1B, 2, 3:
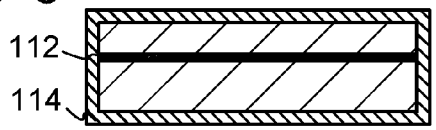
Figure 1C:
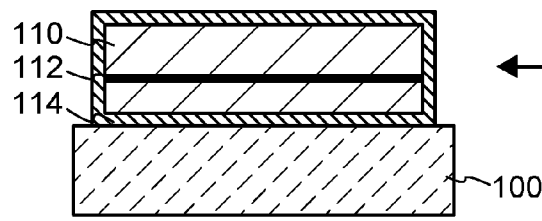

Next, the base substrate 100 and the bond substrate 110 are bonded to each other (see FIG. 1C). Specifically, the base substrate 100 and the bond substrate 110 are bonded to each other with the insulating layer 114 positioned therebetween. After a surface of the base substrate 100 is put in contact with a surface of the insulating layer 114, a pressure treatment realizes the bond between the base substrate 100 and the bond substrate 110. Note that as a bonding mechanism, a mechanism related to van der Waals' force, a mechanism related to hydrogen bonding, or the like is considered.

Note that before the bond substrate 110 and the base substrate 100 are bonded to each other, at least one of the base substrate 100 and the insulating layer 114 formed on the single crystal semiconductor substrate is preferably subjected to a plasma treatment. The plasma treatment for at least one of the insulating layer 114 and the base substrate 100 contributes to an increase in hydrophilic groups or improvement of planarity. Accordingly, the bond strength between the bond substrate 110 and the base substrate 100 can be enhanced.

Here, when capacitively coupled plasma is used, the plasma treatment is performed using plasma generated by introducing an inert gas (such as an Ar gas) into a chamber in a vacuum state and applying high-frequency voltage between an electrode provided with the substrate to be processed (e.g., the base substrate 100 or the bond substrate 110) and the counter electrode. Since electrons and Ar cations are present in the plasma and a self bias is generated on the surface of the substrate to be processed, the Ar cations are accelerated to the substrate to be processed side. By collision of the accelerated Ar cations with the surface of the base substrate 100, the surface of the base substrate 100 is etched by sputtering. At this time, a projection of the surface of the base substrate 100 is preferentially etched by sputtering; thus, the planarity of the surface of the base substrate 100 can be improved. Further, by the accelerated Ar cations, impurities such as organic substances on the base substrate 100 can be removed and the base substrate 100 can be activated. Although an Ar gas is used here as an example, a rare gas such as a He gas, a Ne gas, or a Xe gas can be alternatively used as an inert gas.

In this embodiment, the plasma treatment is performed using an Ar gas by an inductively coupled plasma (ICP) method. Specifically, the treatment with Ar plasma may be performed under conditions where the ICP power is greater than or equal to 100 W and less than or equal to 3000 W, the pressure is higher than or equal to 0.1 Pa and lower than or equal to 5.0 Pa, the gas flow rate is greater than or equal to 5 sccm and less than or equal to 2000 sccm, and the RF bias voltage is greater than or equal to 75 W and less than or equal to 300 W. The following are more specific conditions: the ICP power is 500 W (0.11 W/cm$^2$), the pressure is 1.35 Pa, the gas flow rate is 100 sccm, and the RF bias voltage is 100 W (0.61 W/cm$^2$).

After the bond substrate 110 and the base substrate 100 are bonded to each other, the bond substrate 110 and the base substrate 100 that are bonded may preferably be subjected to a heat treatment so that the bond is strengthened. The heat temperature at this time is preferably a temperature that does not promote a split at the embrittlement region 112. For example, the temperature is set to lower than 400° C., preferably 300° C. or lower. There is no particular limitation on the length of the time for the heat treatment, which may be optimally set as appropriate depending on the relationship between the treatment time and the bond strength. For instance, the heat treatment can be performed at 200° C. for two hours. Further, only the region for bonding can be locally heated by irradiation with microwaves or the like. When there is no problem with the bond strength, the above heat treatment may be omitted.

Figure 1D:
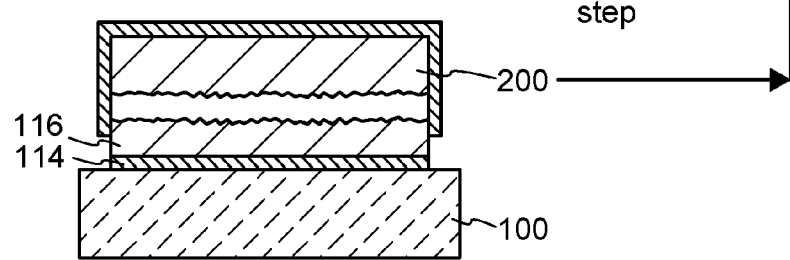

Next, the bond substrate 110 is split into a semiconductor layer 116 and a bond substrate 200 at the embrittlement region 112 (see FIG. 1D). The bond substrate 110 may preferably be split by a heat treatment. The temperature for the heat treatment can be set based on the upper temperature limit of the base substrate 100. For instance, when a glass substrate is used as the base substrate 100, the temperature for the heat treatment is preferably set to higher than or equal to 400° C. and lower than or equal to 750° C. However, as long as the glass substrate can withstand a temperature higher than this range, the temperature is not limited thereto. Note that in this embodiment, the heat treatment is performed at 600° C. for two hours.

The above heat treatment causes a change in the volume of microvoids formed in the embrittlement region 112, resulting in generation of a crack in the embrittlement region 112. As a result, the bond substrate 110 is split along the embrittlement region 112. Accordingly, the semiconductor layer 116 separated from the bond substrate 110 remains over the base substrate 100. Further, since the interface for bonding the substrate 110 and the base substrate 100 is heated by this heat treatment, a covalent bond is formed at the interface, so that the bond strength can be further enhanced.

The planarity of the semiconductor layer 116 which is formed in the above-described manner is reduced by the splitting step. Therefore, a treatment for improving the planarity of the surface of the semiconductor layer 116 is performed.

Further, the bond substrate 200 after the split becomes a reprocessed bond substrate through a reprocessing step, and can be reused. The surface of the bond substrate 200 after the split has defects due to the embrittlement region 112 or the like and thus is desirably subjected to a treatment for improving the planarity.

In this embodiment, improvement of the planarity of the semiconductor layer 116 is realized by performing a plasma treatment on the semiconductor layer 116. By performing a plasma treatment on the semiconductor layer 116, ions or plasma collides with the surface of the semiconductor layer 116 and the surface can be modified. Specifically, a projection of the surface of the semiconductor layer 116 is preferentially removed, so that the planarity is improved.

Here, in the above-described plasma treatment, the surface of the semiconductor layer 116 and a semiconductor target containing the same semiconductor material as the semiconductor layer 116 are disposed to face each other. For example, the plasma treatment can be performed in a state where the semiconductor layers 116 over at least two base substrates 100 which are formed through similar steps face each other. FIG. 2 illustrates a case where a surface treatment is performed in a state where two semiconductor layers (a semiconductor layer 204a and a semiconductor layer 204b) face each other. By employing such a structure, a surface treatment can be performed on a plurality of semiconductor layers at a time and treatment efficiency is thus increased. Note that the bond substrate 200 after the split can be used as the semiconductor target.

The above-described plasma treatment can be performed in a sputtering apparatus, for example. FIG. 2 illustrates a sputtering apparatus. In a vacuum chamber 202 of the sputtering apparatus illustrated in FIG. 2, the semiconductor layers 204a and 204b are placed. Each of the semiconductor layers 204a and 204b is the semiconductor layer 116 separated from the bond substrate 110 and provided over the base substrate 100. In FIG. 2, each of the semiconductor layers 204a and 204b is fixed to an electrode (not shown) connected to a power source 210.

First, the pressure in the vacuum chamber 202 is set to a reduced-pressure state or a vacuum state with the use of an exhaust means (not shown) connected to an exhaust pipe 212, and an Ar gas as a sputtering gas is introduced through a supply pipe 214 connected to a gas supply means (not shown). After that, the sputtering gas is excited by voltage application to the semiconductor layers 204a and 204b, and the semiconductor layers 204a and 204b are subjected to a plasma treatment (which is also referred to as a sputtering treatment) with the use of excited ions or plasma. Any of a DC (direct current) power source and an RF (radiofrequency) power source can be used as the power source for the plasma treatment. For example, when a glass substrate is used as the base substrate 100, the RF power source is preferably used. When a conductive substrate is used as the base substrate 100, the DC power source is preferably used.

The semiconductor layers 204a and 204b may be heated during the plasma treatment. In that case, it is possible that the semiconductor layers 204a and 204b are held in the vacuum chamber 202 in which the pressure is set to a vacuum state, and the semiconductor layers 204a and 204b are heated so that the temperature of the semiconductor layers 204a and 204b is higher than or equal to 100° C. and lower than 900° C., preferably higher than or equal to 200° C. and lower than or equal to 400° C. Then, a plasma treatment is performed with the use of the above semiconductor layers 204a and 204b by introducing a sputtering gas (Ar) while moisture in the vacuum chamber 202 is removed. When the semiconductor material is deposited while the semiconductor layers 204a and 204b are heated with the use of a heater, damage due to the plasma treatment can be further reduced. Note that in the case where a glass substrate is used as the base substrate, the temperature is preferably lower than the strain point of the glass.

By employing such a structure, the plasma treatment can be performed on one of the semiconductor layers, and the semiconductor material can be deposited on a surface of the other semiconductor layer. When a plasma treatment is performed on the one semiconductor layer, a surface of the semiconductor layer is sputtered and thus planarized. As a result of the sputtering of the one semiconductor layer, the semiconductor material is deposited over the other semiconductor layer which is provided so as to face the one semiconductor layer. The surface roughness of the other semiconductor layer is reduced by deposition of the semiconductor material in such a manner; therefore, the planarity of the surface of the other semiconductor layer is also improved.

As described above, when one of the semiconductor layers is subjected to the plasma treatment, the other semiconductor layer has an increased thickness and the former semiconductor layer has a reduced thickness. Therefore, after the plasma treatment is performed on one of the semiconductor layers, the other semiconductor layer is desirably subjected to a plasma treatment. By repeating such a treatment, the planarity of the surfaces can be sufficiently increased in both of the semiconductor layers. Note that when one of the semiconductor layers is considered, the above-described treatment is a treatment in which a plasma treatment and a deposition treatment of the semiconductor material are alternately repeated.

Needless to say, as long as it is possible to suppress a reduction in the thickness while the planarity of the surface of the semiconductor layer is improved, the method is not limited to the treatment in which the plasma treatment and the deposition treatment of the semiconductor material are alternately repeated. Alternatively, it is possible to perform the following steps at the same time: a step in which planarization of the surface of one of the semiconductor layers by the plasma treatment and deposition of the semiconductor material over the other semiconductor layer are performed; and a step in which planarization of the surface of the other semiconductor layer by the plasma treatment and deposition of the semiconductor material over the surface of the one semiconductor layer are performed.

Although FIG. 2 illustrates the case where the plasma treatment is performed with the semiconductor layers 204a and 204b which are provided over the base substrates facing each other, an embodiment of the present invention is not limited thereto. The plasma treatment can be performed with a semiconductor layer provided over a base substrate and a bond substrate from which the semiconductor layer is separated facing each other. In this case, a treatment for improving the planarity of the semiconductor layer and a reprocessing treatment of the bond substrate after the split are performed at the same time.

Further, by applying the technical idea, the above-described treatment may be performed with at least two bond substrates 200 facing each other. In this case, the bond substrate 200 after the split can be efficiently reprocessed. As the reprocessing treatment, in addition to the above-described plasma treatment, a heat treatment, an etching treatment, or a combination of a heat treatment and an etching treatment can be performed. The bond substrates 200 which are subjected to such a reprocessing treatment can be reused as the bond substrates 110.

By employing such structures, a surface treatment can be performed on a plurality of semiconductor layers and bond substrates at a time and treatment efficiency is thus increased.

Note that after the above treatment, the semiconductor layer 116 and the like may be irradiated with a laser beam. Irradiating the semiconductor layer 116 with a laser beam makes the semiconductor layer 116 melt, so that the semiconductor layer 116 cools and solidifies, resulting in formation of a semiconductor layer in which the defects are reduced and the surface planarity is further improved.

Further, after the above treatment, a thinning step for reducing the thickness of the semiconductor layer may be carried out. To thin the semiconductor layer, either a dry etching treatment, or a wet etching treatment, or a combination of both can be performed. For example, when the semiconductor layer is formed of silicon, the semiconductor layer can be thinned using $SF_6$ and $O_2$ as process gases by a dry etching treatment. Further, in the thinning step, a polishing treatment such as CMP may be performed instead of an etching treatment; alternatively, a combination of an etching treatment and a CMP treatment may be performed.

Figure 1E:
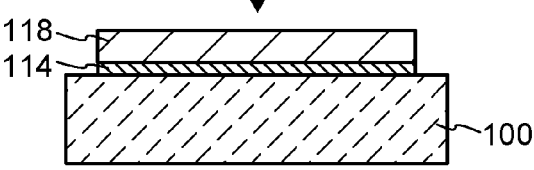
Figure 2:
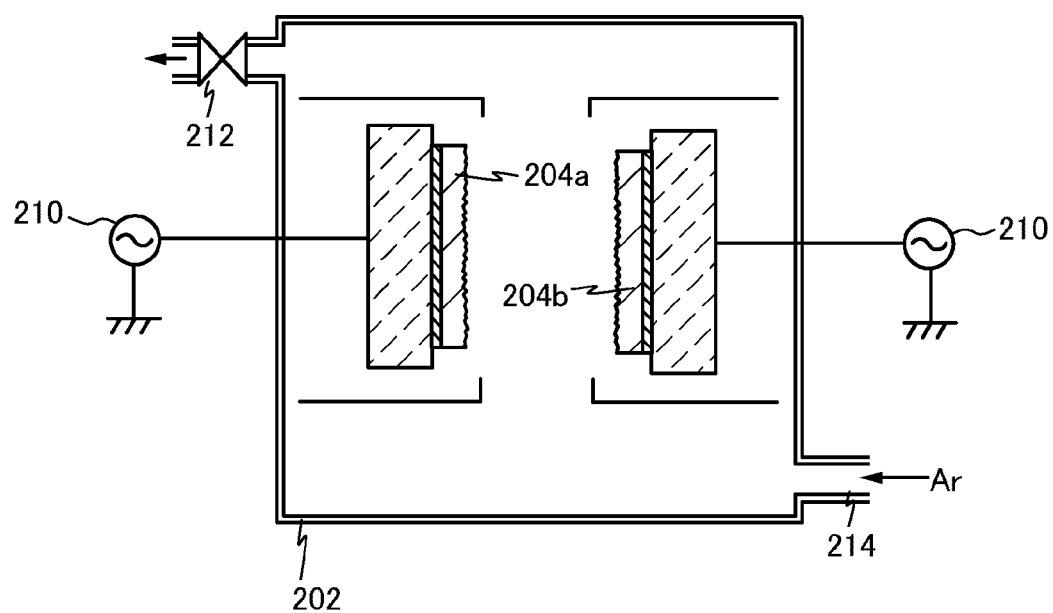

As described above, a semiconductor layer 118 can be formed over the base substrate 100 (see FIG. 1E). The semiconductor layer 118 can have a thickness greater than or equal to 10 nm and less than or equal to 200 nm.

As described above, according to an embodiment of the present invention, a surface of a semiconductor layer can be efficiently planarized. This can lead to reduction of manufacturing cost of an SOI substrate. In addition, a bond substrate can be efficiently reprocessed according to an embodiment of the present invention. Therefore, manufacturing cost of an SOI substrate manufactured by using the reprocessed bond substrate can be reduced.

This embodiment can be implemented in appropriate combination with the structures described in the other embodiments.

Embodiment 2

In this embodiment, another example of a manufacturing method of an SOI substrate is described with reference to FIGS. 3A-1, 3A-2, 3B-1 to 3B-3, 3C, 3D, and 3E. This embodiment is different from Embodiment 1 in that an insulating layer 101 is formed over a base substrate. Therefore, this point is mainly described below.

Figures 1, 3A:
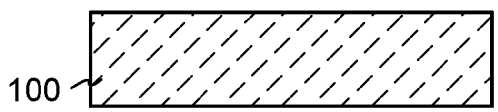
Figures 2, 3A:
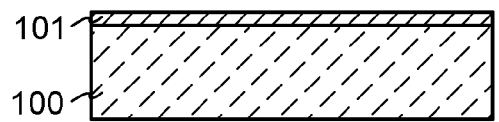

First, the base substrate 100 is prepared (see FIG. 3A-1), and the insulating layer 101 is formed over the base substrate (see FIG. 3A-2). Refer to FIG. 1A for the base substrate 100.

There is no particular limitation on the method for forming the insulating layer 101, to which a sputtering method, a plasma CVD method, or the like can be applied, for example. Since the insulating layer 101 has a surface for bond, the insulating layer 101 is preferably formed such that this surface has high planarity. The insulating layer 101 can be formed using one or more materials selected from a silicon oxide, a silicon nitride, a silicon oxynitride, a silicon nitride oxide, an aluminum oxide, an aluminum nitride, an aluminum oxynitride, an aluminum nitride oxide, and the like. For example, when a silicon oxide is used for the insulating layer 101, formation using an organosilane gas by a chemical vapor deposition method enables the insulating layer 101 to have excellent planarity. Note that although the insulating layer 101 has a single-layer structure in this embodiment, the insulating layer 101 may have a stacked-layer structure.

Figures 1, 3B:
Figures 2, 3B:
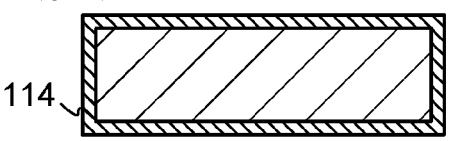
Figures 3, 3B:
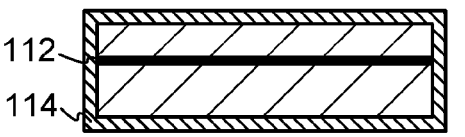

Next, the bond substrate 110 is prepared, and the insulating layer 114 is formed on the surface of the bond substrate 110. The bond substrate 110 is irradiated with ions, whereby the embrittlement region 112 is formed (see FIG. 3B-1 to FIG. 3B-3). The steps of FIG. 3B-1 to FIG. 3B-3 are the same as those of FIG. 1B-1 to FIG. 1B-3, and therefore details thereof are omitted.

Figure 3C:
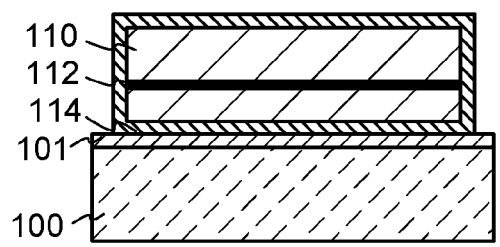

Then, the base substrate 100 and the bond substrate 110 are bonded to each other (see FIG. 3C). Specifically, the base substrate 100 and the bond substrate 110 are bonded to each other with the insulating layer 101 and the insulating layer 114 positioned therebetween. Through a pressure treatment after the surface of the insulating layer 101 is put in contact with the surface of the insulating layer 114, the base substrate 100 and the bond substrate 110 are bonded to each other.

Note that before the bond substrate 110 and the base substrate 100 are bonded to each other, it is preferable to subject the single crystal semiconductor substrate, the insulating layer 114 formed on the bond substrate 110, the base substrate 100, or the insulating layer 101 formed on the base substrate 100 to a surface treatment. The surface treatment can improve the bond strength at the bond interface between the bond substrate 110 and the base substrate 100.

As examples of the surface treatment, a wet etching treatment, a dry etching treatment, and a combination of both are given. Alternatively, a combination of different wet etching treatments or a combination of different dry etching treatments may be employed.

Examples of the wet etching treatment include an ozone treatment using ozone water (ozone water cleaning), megasonic cleaning, two-fluid cleaning (a method in which functional water such as pure water or hydrogenated water and a carrier gas such as nitrogen are sprayed together), and the like. Examples of the dry etching treatment include an ultraviolet treatment, an ozone treatment, a plasma treatment, a plasma treatment with bias application, a radical treatment, and the like. The surface treatment as described above has the effect of improving hydrophilicity and cleanliness of a surface of the object to be processed (i.e., the single crystal semiconductor substrate, the insulating layer formed on the single crystal semiconductor substrate, the base substrate, or the insulating layer formed on the base substrate). As a result, the bond strength between the substrates can be improved.

The wet etching treatment is effective for removal of macro dust and the like adhering to a surface of the object to be processed. The dry etching treatment is effective for removal or decomposition of micro dust such as an organic substance which adheres to a surface of the object to be processed. Here, it is preferable that the wet etching treatment such as cleaning be performed after the dry etching treatment such as an ultraviolet treatment, because, in this case, the surface of the object to be processed can be made clean and hydrophilic and generation of watermarks on the surface can be suppressed.

Alternatively, it is preferable to perform a surface treatment using ozone or oxygen in an active state such as singlet oxygen as the dry etching treatment. Ozone or oxygen in an active state such as singlet oxygen enables effective removal or decomposition of organic substances adhering to the surface of the object to be processed. Further, by use of ozone or oxygen in an active state such as singlet oxygen in combination with light having a wavelength less than 200 nm, which is an ultraviolet ray to perform the treatment, the organic substances adhering to the surface of the object to be processed can be removed more effectively. Specific description thereof is made below.

For example, the surface treatment of the object to be processed is performed by irradiation with ultraviolet light in an atmosphere containing oxygen. By irradiation with light having a wavelength less than 200 nm and light having a wavelength of 200 nm or more, which are ultraviolet rays, in an atmosphere containing oxygen, singlet oxygen as well as ozone can be generated. Alternatively, by irradiation with light having a wavelength less than 180 nm, which is an ultraviolet ray, singlet oxygen as well as ozone can be generated.

An example of a reaction caused by irradiation with ultraviolet light having a wavelength less than 200 nm and ultraviolet light having a wavelength of 200 nm or more in an atmosphere containing oxygen is described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), by irradiation with ultraviolet light (hν) having a wavelength less than 200 nm ($\lambda_1$ nm) in an atmosphere containing oxygen ($O_2$), oxygen atoms in a ground state ($O(^3P)$) are generated. Next, in the reaction formula (2), the oxygen atoms ($O(^3P)$) in a ground state and the oxygen ($O_2$) are reacted to generate ozone ($O_3$). Then, in the reaction formula (3), by irradiation with ultraviolet light having a wavelength of 200 nm or more ($\lambda_2$ nm) in an atmosphere containing the generated ozone ($O_3$), singlet oxygen $O(^1D)$ in an excited state is generated. In an atmosphere containing oxygen, ozone is generated by irradiation with light having a wavelength less than 200 nm, which is an ultraviolet ray while ozone is decomposed and singlet oxygen is generated by irradiation with light having a wavelength of 200 nm or more, which is an ultraviolet ray. The surface treatment as described above can be performed by, for example, irradiation using a low-pressure mercury lamp ($\lambda_1$=185 nm, $\lambda_2$=254 nm) in an atmosphere containing oxygen.

Further, an example of a reaction caused by irradiation with ultraviolet light having a wavelength less than 180 nm in an atmosphere containing oxygen is described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), by irradiation with ultraviolet light having a wavelength less than 180 nm ($\lambda_3$ nm) in an atmosphere containing oxygen ($O_2$), singlet oxygen in an excited state $O(^1D)$ and oxygen atoms in a ground state ($O(^3P)$) are generated. Next, in the reaction formula (5), the oxygen atoms ($O(^3P)$) in a ground state and the oxygen ($O_2$) are reacted to generate ozone ($O_3$). In the reaction formula (6), by irradiation with ultraviolet light having a wavelength less than 180 nm ($\lambda_3$ nm) in an atmosphere containing the generated ozone ($O_3$), singlet oxygen in an excited state and oxygen are generated. In an atmosphere containing oxygen, by irradiation with light having a wavelength less than 180 nm, which is an ultraviolet ray, ozone is generated and singlet oxygen is generated by decomposing the ozone or oxygen. The surface treatment as described above can be performed by, for example, irradiation using a Xe excimer UV lamp in an atmosphere containing oxygen.

The ultraviolet light having a wavelength less than 200 nm causes breakage of a chemical bond in an organic substance and the like adhering to the surface of the object to be processed. With ozone or singlet oxygen, an organic substance adhering to the surface of the object or the organic substance in which the chemical bond is broken can be removed by oxidative-decomposition. The surface treatment as described above can enhance the hydrophilicity and cleanliness of the surface of the object to be processed, making the bond more preferable.

Although the surface treatment is performed before the base substrate 100 is bonded to the bond substrate 110 in this embodiment, an embodiment of the present invention is not limited thereto. The surface treatment may be replaced with the plasma treatment described in Embodiment 1 or combined with the plasma treatment. Note that in Embodiment 1, the plasma treatment may be replaced with the surface treatment described in Embodiment 2 or combined with the plasma treatment.

Figure 3D:
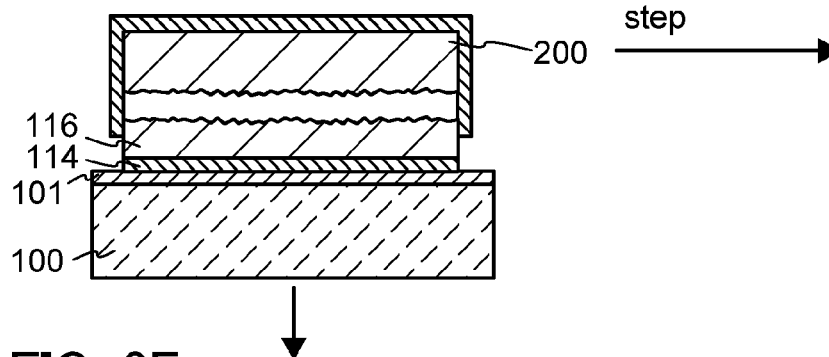

Next, the bond substrate 110 is split into the semiconductor layer 116 and the bond substrate 200 at the embrittlement region 112 (see FIG. 3D). Accordingly, the semiconductor layer 116 remains over the base substrate 100.

Then, the surface of the semiconductor layer 116 separated from the bond substrate 110 and the bond substrate 200 after the split are subjected to a sputtering treatment, whereby the surfaces have improved planarity. The sputtering treatment can be performed in a similar manner to Embodiment 1 (FIG. 2) and therefore detailed description is omitted.

Figure 3E:
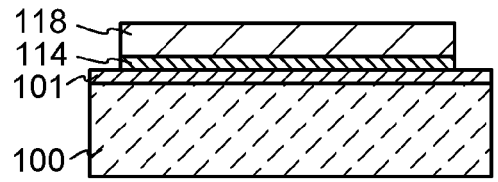

After that, the treatment of reducing defects, the treatment of improving the surface planarity, or the like is performed on the semiconductor layer 116, whereby the semiconductor layer 118 can be formed over the base substrate 100 (see FIG. 3E). Note that the steps of FIGS. 3D and 3E can be performed in the same way as those of FIGS. 1D and 1E, and therefore details thereof are omitted.

Note that when a heat treatment or an etching treatment is performed in addition to the sputtering treatment described in Embodiment 1 (FIG. 2) in a reprocessing treatment, the bond substrate 200 can be reused as the bond substrate 110.

As described above, according to an embodiment of the present invention, a surface of a semiconductor layer can be efficiently planarized. This can lead to reduction of manufacturing cost of an SOI substrate. In addition, a bond substrate can be efficiently reprocessed according to an embodiment of the present invention. Therefore, manufacturing cost of an SOI substrate manufactured by using the reprocessed bond substrate can be reduced.

This embodiment can be implemented in appropriate combination with the structures described in the other embodiments.

Embodiment 3

In this embodiment, a manufacturing method of a semiconductor device using the SOI substrate according to the aforementioned embodiment will be described with reference to FIGS. 4A to 4E and FIGS. 5A to 5D. In this embodiment, a manufacturing method of a semiconductor device including a plurality of transistors will be described as an example of the semiconductor device. Various semiconductor devices can be formed with the use of transistors described below in combination.

Figure 4A:
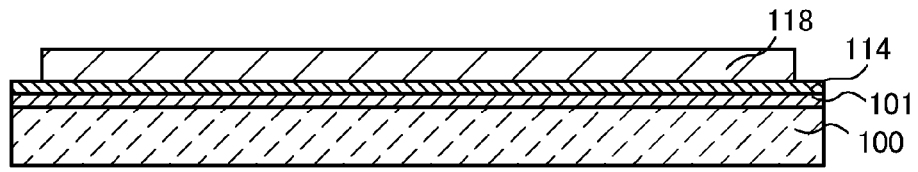
FIGS. 4A to 4E are cross-sectional views illustrating an example of a manufacturing process of a semiconductor device.

FIG. 4A is a cross-sectional view illustrating a part of the SOI substrate manufactured using the method described in aforementioned embodiment.

The semiconductor layer 118 corresponds to the semiconductor layer 118 in FIG. 3E and has a surface whose planarity is improved.

In order to control the threshold voltage of the transistor, a p-type impurity element such as boron, aluminum, or gallium, or an n-type impurity element such as phosphorus or arsenic may be added to the semiconductor layer 118. A region to which the impurity element is added and the kind of impurity element to be added can be changed as appropriate. For example, a p-type impurity element is added to a region where an n-channel transistor is formed, and an n-type impurity element is added to a region where a p-channel transistor is formed.

Figure 4B:
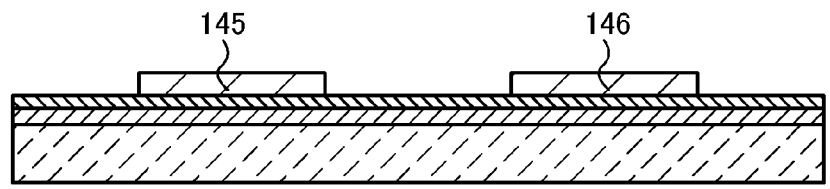

Then, the semiconductor layer 118 is divided into island shapes to form a semiconductor layer 145 and a semiconductor layer 146 (see FIG. 4B). By using the semiconductor layers 145 and 146 with less surface roughness as active layers, the reliability of the semiconductor device can be increased.

Figure 4C:
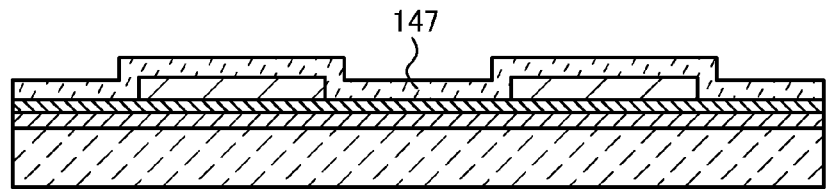

Next, a gate insulating film 147 is formed so as to cover the semiconductor layers 145 and 146 (see FIG. 4C). Here, a single-layer silicon oxide film is formed by a plasma CVD method. Alternatively, a film containing a silicon oxynitride, a silicon nitride oxide, a silicon nitride, a hafnium oxide, an aluminum oxide, a tantalum oxide, or the like may be formed to have a single-layer structure or a stacked-layer structure as the gate insulating film 147.

As examples of a manufacturing method other than a plasma CVD method, a sputtering method or a method using oxidation or nitridation by a high density plasma treatment can be given. A high-density plasma treatment is performed using, for example, a mixed gas of a rare gas such as helium, argon, krypton, or xenon; and a gas such as oxygen, a nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since oxidation or nitridation of the semiconductor layers through the above high-density plasma treatment is a solid-phase reaction, the interface state density between the gate insulating film 147 and each of the semiconductor layers 145 and 146 can be drastically reduced. Further, the semiconductor layers are directly oxidized or nitrided by the high-density plasma treatment, whereby variation in the thickness of the insulating film to be formed can be suppressed. Since the semiconductor layers are single crystal films, even when the surfaces of the semiconductor layers are oxidized by a solid-phase reaction by using the high-density plasma treatment, a gate insulating film with high uniformity and low interface state density can be formed. When an insulating film formed by the high-density plasma treatment as described above is used for a part or whole of the gate insulating film of a transistor, variation in characteristics can be suppressed.

Alternatively, the gate insulating film 147 may be formed by thermally oxidizing the semiconductor layers 145 and 146. In this case, the gate insulating film is formed on the surfaces of the semiconductor layers 145 and 146. In the case of such thermal oxidation, it is necessary to use a glass substrate having a certain degree of heat resistance.

Note that after the gate insulating film 147 containing hydrogen is formed, hydrogen contained in the gate insulating film 147 may be dispersed into the semiconductor layers 145 and 146 by performing a heat treatment at a temperature higher than or equal to 350° C. and lower than or equal to 450° C. In this case, the gate insulating film 147 can be formed using a silicon nitride or a silicon nitride oxide by a plasma CVD method. Further, a process temperature is preferably set to 350° C. or lower. Thus, hydrogen is supplied to the semiconductor layers 145 and 146 so that defects in the semiconductor layer 145, the semiconductor layer 146, an interface between the gate insulating film 147 and the semiconductor layer 145, and an interface between the gate insulating film 147 and the semiconductor layer 146 can be reduced effectively.

Figure 4D:
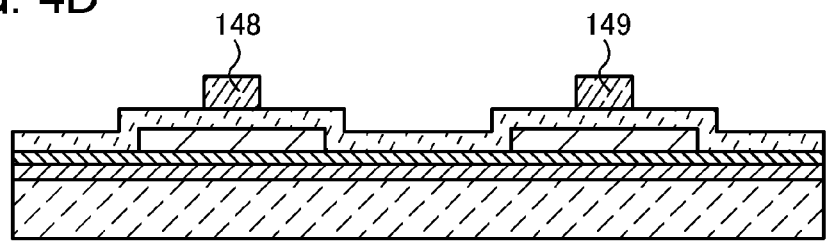

Next, a conductive film is formed over the gate insulating film 147, and then, the conductive film is processed (patterned) into a predetermined shape, whereby an electrode 148 and an electrode 149 are formed over the semiconductor layer 145 and the semiconductor layer 146, respectively (see FIG. 4D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material, such as polycrystalline silicon which is obtained by doping a semiconductor with an impurity element that imparts a conductivity type, may be used.

Although the electrodes 148 and 149 are formed using a single-layer conductive film in this embodiment, the semiconductor device according to an embodiment of the disclosed invention is not limited to this structure. Each of the electrodes 148 and 149 may be formed by stacking a plurality of conductive films. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be used.

Note that a mask used for forming the electrodes 148 and 149 may be formed using a material such as a silicon oxide or a silicon nitride oxide. In this case, a step of forming a mask by patterning a silicon oxide film, a silicon nitride oxide film, or the like is additionally needed; however, a reduction in film thickness of the mask in etching is smaller than that in the case of using a resist material; thus, the electrodes 148 and 149 with more precise shapes can be formed. Alternatively, the electrodes 148 and 149 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrodes 148 and 149 can be formed by etching the conductive film to have desired tapered shapes by an inductively coupled plasma (ICP) etching method with appropriate adjustment of etching conditions (the amount of electric power applied to a coil-shaped electrode, the amount of electric power applied to an electrode on a substrate side, the temperature of the electrode on the substrate side, or the like). The tapered shape can be controlled according to the shape of the mask. Note that as an etching gas, a chlorine-based gas such as chlorine, boron chloride, silicon chloride, or carbon tetrachloride, a fluorine-based gas such as a carbon tetrafluoride, a sulfur fluoride, or a nitrogen fluoride, oxygen, or the like can be used as appropriate.

Figure 4E:
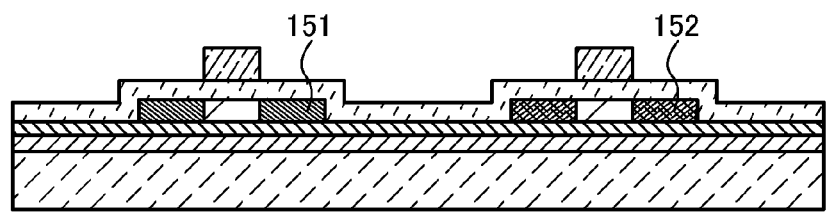

Next, by using the electrodes 148 and 149 as masks, an impurity element imparting one conductivity type is added to the semiconductor layers 145 and 146 (see FIG. 4E). In this embodiment, an impurity element imparting n-type conductivity (for example, phosphorus or arsenic) is added to the semiconductor layer 145, and an impurity element imparting p-type conductivity (for example, boron) is added to the semiconductor layer 146. Note that when the impurity element imparting n-type conductivity is added to the semiconductor layer 145, the semiconductor layer 146 to which the impurity element imparting p-type conductivity is added is covered with a mask or the like so that the impurity element imparting n-type conductivity is added selectively. When the impurity element imparting p-type conductivity is added to the semiconductor layer 146, the semiconductor layer 145 to which the impurity element imparting n-type conductivity is added is covered with a mask or the like so that the impurity element imparting p-type conductivity is added selectively. Alternatively, after one of the impurity element imparting p-type conductivity and the impurity element imparting n-type conductivity is added to the semiconductor layers 145 and 146, the other of the impurity element imparting n-type conductivity and the impurity element imparting p-type conductivity may be added to only one of the semiconductor layers 145 and 146 at a higher concentration. By the above-described impurity addition, an impurity region 151 is formed in the semiconductor layer 145 and an impurity region 152 is formed in the semiconductor layer 146.

Figure 5A:
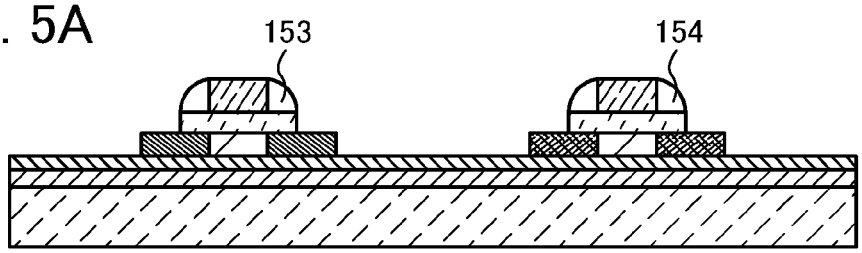
FIGS. 5A to 5D are cross-sectional views illustrating an example of a manufacturing process of a semiconductor device.

Next, sidewalls 153 are formed on side surfaces of the electrode 148, and sidewalls 154 are formed on side surfaces of the electrode 149 (see FIG. 5A). The sidewalls 153 and 154 can be formed by, for example, newly forming an insulating film so as to cover the gate insulating film 147 and the electrodes 148 and 149 and partly etching the newly formed insulating film with anisotropic etching. Note that the gate insulating film 147 may also be etched partly by the anisotropic etching described above. For the insulating film used for forming the sidewalls 153 and 154, a film containing silicon, a silicon oxide, a silicon nitride, a silicon oxynitride, a silicon nitride oxide, an organic material, or the like may be formed to have a single layer structure or a stacked-layer structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that the steps of forming the sidewalls 153 and 154 are not limited to the steps described here.

Figure 5B:
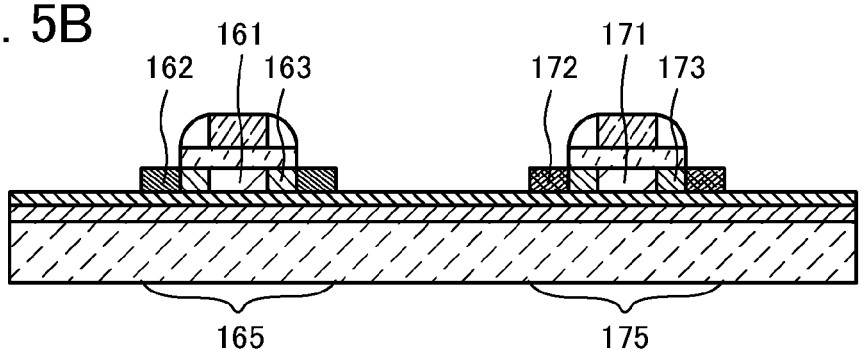

Next, impurity elements each imparting one conductivity type are added to the semiconductor layers 145 and 146 using the gate insulating film 147, the electrodes 148 and 149, and the sidewalls 153 and 154 as masks (see FIG. 5B). Note that in each of the semiconductor layers 145 and 146, an impurity element imparting the same conductivity as the impurity element which has been added in the previous step is added at a higher concentration. Here, when the impurity element imparting n-type conductivity is added to the semiconductor layer 145, the semiconductor layer 146 to which the impurity element imparting p-type conductivity is added is covered with a mask or the like so that the impurity element imparting n-type conductivity is added selectively. When the impurity element imparting p-type conductivity is added to the semiconductor layer 146, the semiconductor layer 145 to which the impurity element imparting n-type conductivity is added is covered with a mask or the like so that the impurity element imparting p-type conductivity is added selectively.

By the above-described addition of the impurity element, a pair of high-concentration impurity regions 162, a pair of low-concentration impurity regions 163, and a channel formation region 161 are formed in the semiconductor layer 145. In addition, by the above-described addition of the impurity element, a pair of high-concentration impurity regions 172, a pair of low-concentration impurity regions 173, and a channel formation region 171 are formed in the semiconductor layer 146. The high-concentration impurity regions 162 and the high-concentration impurity regions 172 each function as a source or a drain, and the low-concentration impurity regions 163 and the low-concentration impurity regions 173 each function as a lightly doped drain (LDD) region.

Note that the sidewalls 153 formed over the semiconductor layer 145 and the sidewalls 154 formed over the semiconductor layer 146 may be formed so as to have the same length or different lengths in a direction in which carriers move (in a direction parallel to a so-called channel length). For example, the sidewalls 154 over the semiconductor layer 146 which constitutes a part of a p-channel transistor is preferably formed to have a longer length in the direction in which carriers move than that of the sidewalls 153 over the semiconductor layer 145 which constitutes a part of an n-channel transistor. By increasing the lengths of the sidewalls 154 of the p-channel transistor, a short channel effect due to diffusion of boron can be suppressed; therefore, boron can be added to the source and the drain at a high concentration. Accordingly, the resistance of the source and the drain can be sufficiently reduced.

In order to further reduce the resistance of the source and the drain, a silicide region may be formed by forming silicide in a part of the semiconductor layers 145 and 146. The silicide is formed by placing metal in contact with the semiconductor layers and allowing the metal and silicon in the semiconductor layers to be reacted by a heat treatment (a GRTA method, an LRTA method, or the like). For the silicide region, cobalt silicide, nickel silicide, or the like may be used. In the case where the semiconductor layers 145 and 146 are thin, silicide reaction may proceed to bottoms of the semiconductor layers 145 and 146. As a metal material used for the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide region can also be formed by laser beam irradiation or the like.

Through the above steps, an n-channel transistor 165 and a p-channel transistor 175 are formed. Note that although conductive films each serving as a source electrode or a drain electrode have not been formed at the stage in FIG. 5B, a structure including these conductive films each serving as a source electrode or a drain electrode may also be referred to as a transistor.

Figure 5C:
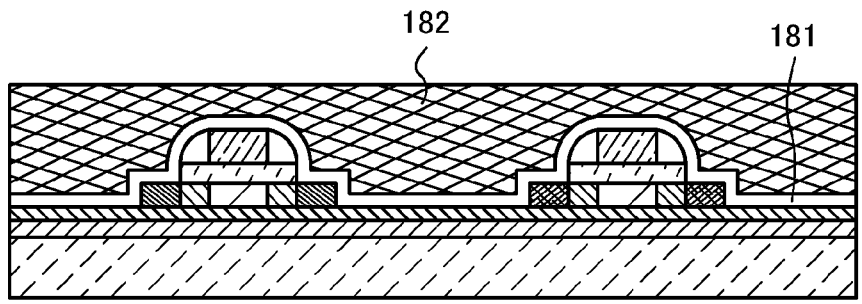
Figure 5D:
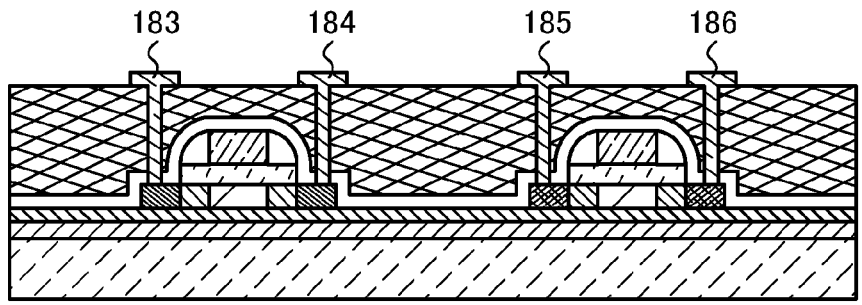

Next, an insulating film 181 is formed so as to cover the n-channel transistor 165 and the p-channel transistor 175 (see FIG. 5C). The insulating film 181 is not necessarily provided; however, the insulating film 181 can prevent impurities such as alkali metal and alkaline earth metal from entering the n-channel transistor 165 and the p-channel transistor 175. Specifically, the insulating film 181 is preferably formed using a material such as a silicon oxide, a silicon nitride, a silicon oxynitride, a silicon nitride oxide, an aluminum nitride, an aluminum oxide, or the like. In this embodiment, a silicon nitride oxide film with a thickness of approximately 600 nm is used as the insulating film 181. In this case, the above-described hydrogenation step may be performed after the silicon nitride oxide film is formed. Note that although the insulating film 181 has a single-layer structure in this embodiment, the insulating film 181 may have a stacked-layer structure. For example, in the case of a two-layer structure, the insulating film 181 can have a stacked-layer structure of a silicon oxynitride film and a silicon nitride oxide film.

Next, an insulating film 182 is formed over the insulating film 181 so as to cover the n-channel transistor 165 and the p-channel transistor 175 (see FIG. 5C). The insulating film 182 may be formed using an organic material having heat resistance, such as polyimide, acrylic, benzocyclobutene, polyamide, or epoxy. Other than such an organic material, it is also possible to use a low-dielectric constant material (a low-k material), a siloxane-based resin, a silicon oxide, a silicon nitride, a silicon oxynitride, a silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, one of fluorine, an alkyl group, or aromatic hydrocarbon as a substituent. Note that the insulating film 182 can also be formed by stacking a plurality of insulating films formed of such materials.

The insulating film 182 can be formed by a CVD method, a sputtering method, an SOG method, a spin coating method, a dip coating method, a spray coating method, a droplet discharge method (e.g., an ink-jet method, screen printing, or offset printing), or a tool (equipment) such as a doctor knife, a roll coater, a curtain coater, a knife coater, or the like depending on the material of the insulating film 182.

Next, contact holes are formed in the insulating films 181 and 182 so that each of the semiconductor layers 145 and 146 is partly exposed. Then, a conductive film 183 and a conductive film 184 which are in contact with the semiconductor layer 145 through the contact holes and a conductive film 185 and a conductive film 186 which are in contact with the semiconductor layer 146 through the contact holes are formed (see FIG. 5D). Each of the conductive films 183, 184, 185, and 186 serves as a source electrode or a drain electrode of the transistor. Note that in this embodiment, as an etching gas for forming the contact holes, a mixed gas of $CHF_3$ and He is employed; however, the etching gas is not limited thereto.

The conductive films 183, 184, 185, and 186 can be formed by a CVD method, a sputtering method, or the like. As a material of the conductive films, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Further, each of the conductive films 183, 184, 185, and 186 may have a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can be given as an example thereof. Aluminum and aluminum silicon (Al—Si), which have low resistance and are inexpensive, are suitable as a material for forming the conductive films 183, 184, 185, and 186. In particular, the aluminum silicon is preferable because a hillock can be prevented from generating due to resist baking at the time of patterning. Further, a material in which Cu is mixed into aluminum at approximately 0.5% may be used instead of silicon.

In the case where each of the conductive films 183, 184, 185, and 186 is formed to have a stacked-layer structure, a stacked-layer structure of a barrier film, an aluminum silicon film, and a barrier film, a stacked-layer structure of a barrier film, an aluminum silicon film, a titanium nitride film, and a barrier film, or the like may be employed, for example. Note that the barrier film refers to a film formed using titanium, a nitride of titanium, molybdenum, a nitride of molybdenum, or the like. By forming the conductive films such that an aluminum silicon film is interposed between barrier films, generation of hillocks of aluminum or aluminum silicon can be further prevented. When a barrier film is formed using titanium, which is an element having a high reducing property, even if a thin oxide film is formed over the semiconductor layers 145 and 146, the oxide film is reduced by titanium contained in the barrier film; thus, favorable contact can be obtained between the semiconductor layer 145 and the conductive films 183 and 184 and between the semiconductor layer 146 and the conductive films 185 and 186. Further, it is also possible to stack a plurality of barrier films. In that case, for example, each of the conductive films 183, 184, 185, and 186 can be formed to have a five-layer structure of titanium, a titanium nitride, aluminum silicon, titanium, and a titanium nitride in order from the bottom or a stacked-layer structure of more than five layers.

For the conductive films 183, 184, 185, and 186, tungsten silicide formed by a chemical vapor deposition method using a $WF_6$ gas and a $SiH_4$ gas may be used. Alternatively, tungsten formed by hydrogen reduction of $WF_6$ may be used for the conductive films 183, 184, 185, and 186.

Note that the conductive films 183 and 184 are connected to the high-concentration impurity regions 162 of the n-channel transistor 165. The conductive films 185 and 186 are connected to the high-concentration impurity regions 172 of the p-channel transistor 175.

Note that although the case where the n-channel transistor 165 and the p-channel transistor 175 each include one electrode serving as a gate electrode (the case where the n-channel transistor 165 and the p-channel transistor 175 include the electrodes 148 and 149, respectively) is described in this embodiment as an example, an embodiment of the disclosed invention is not limited to this structure. The transistors may have a multi-gate structure in which a plurality of electrodes serving as gate electrodes are included and electrically connected to one another.

As described in this embodiment, the SOI substrate in which surface roughness of the semiconductor layer is suppressed is used, so that the yield of the semiconductor device can be improved.

This embodiment can be implemented in appropriate combination with the structures described in the other embodiments.

Embodiment 4

Next, a display device using the SOI substrate according to an embodiment of the present invention is described with reference to FIGS. 6A and 6B and FIGS. 7A and 7B.

Figure 6A:
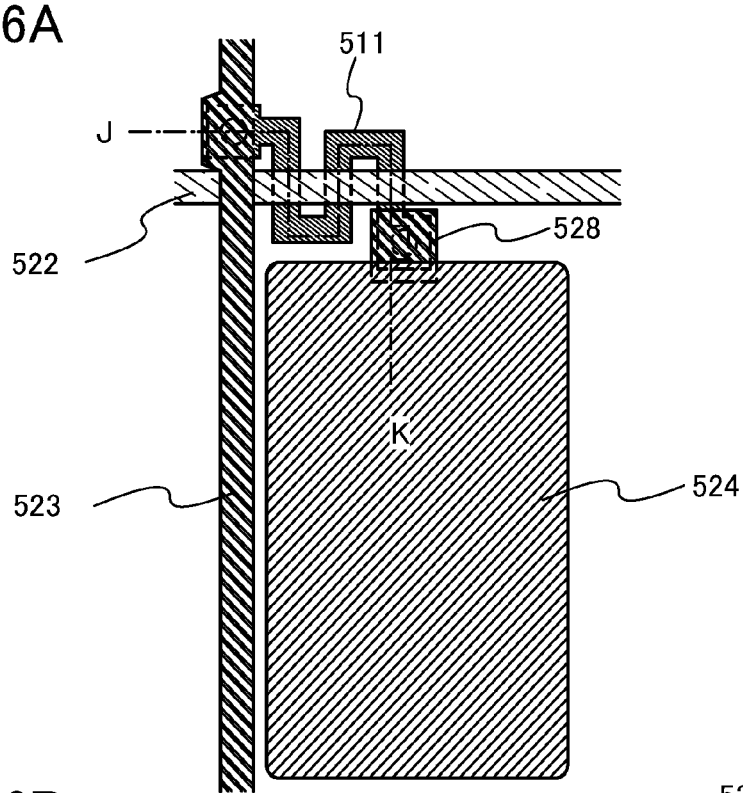
FIGS. 6A and 6B are diagrams illustrating an example of a display device using an SOI substrate.
Figure 6B:
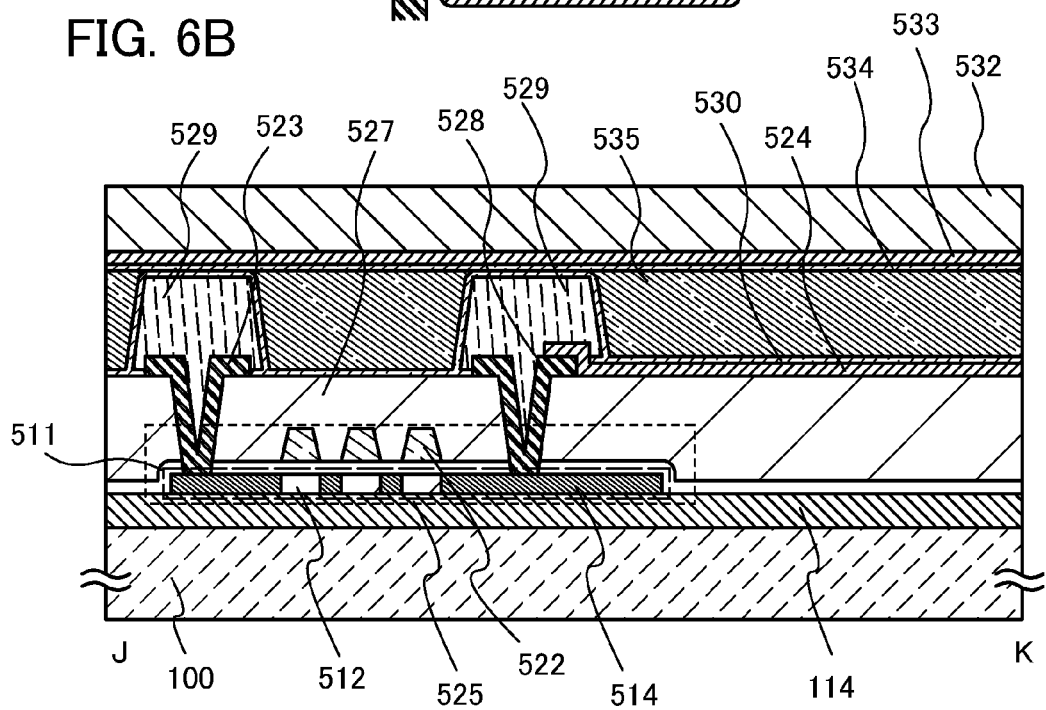

FIGS. 6A and 6B are diagrams illustrating a structural example of a liquid crystal display device. FIG. 6A is a plan view of a pixel of the liquid crystal display device, and FIG. 6B is a cross-sectional view along a section line J-K in FIG. 6A. In FIG. 6A, a semiconductor layer 511 is included in a transistor 525 of a pixel. The pixel includes the semiconductor layer 511; a scan line 522 that crosses the semiconductor layer 511; a signal line 523 that crosses the scan line 522; a pixel electrode 524; and an electrode 528 that electrically connects the pixel electrode 524 and the semiconductor layer 511. The semiconductor layer 511 is a semiconductor layer formed by the method for manufacturing an SOI substrate that is an embodiment of the present invention. It is preferable that a glass substrate be used as the base substrate 100.

As illustrated in FIG. 6B, the insulating layer 114 and the semiconductor layer 511 are stacked over the base substrate 100. The semiconductor layer 511 is a layer formed by etching of the semiconductor layer 118 illustrated in FIG. 1E. In the semiconductor layer 511, a channel formation region 512 and an n-type impurity region 514 are formed. A gate electrode of the transistor 525 is included in the scan line 522, and one of a source electrode and a drain electrode is included in the signal line 523.

Over an interlayer insulating layer 527, the signal line 523, the pixel electrode 524, and the electrode 528 are provided. Further, column spacers 529 are formed over the interlayer insulating layer 527, and an orientation film 530 is formed covering the signal line 523, the pixel electrode 524, the electrode 528, and the columnar spacers 529. On a counter substrate 532, a counter electrode 533 and an orientation film 534 covering the counter electrode 533 are formed. The columnar spacers 529 are formed in order to maintain space between the base substrate 100 and the counter substrate 532. A liquid crystal layer 535 is formed in the space maintained by the columnar spacers 529, which is between the orientation film 534 on the counter substrate 532 side and the orientation film 530 on the base substrate 100 side. At respective connection portions of the signal line 523 and the electrode 528 with the impurity region 514, there are steps caused by the interlayer insulating layer 527, the signal line 523, and the electrode 528; accordingly, orientation of liquid crystals in the liquid crystal layer 535 is likely to be disordered at the connection portion. Therefore, the columnar spacers 529 are formed in step portions to prevent the disorder of orientation of liquid crystals.

Note that a glass substrate can be used as the base substrate 100. Accordingly, a liquid crystal display device manufactured using the SOI substrate according to an embodiment of the present invention, is not limited to a reflective liquid crystal display device and also can be a transmissive liquid crystal display device or a semi-transmissive liquid crystal display device.

Figure 7A:
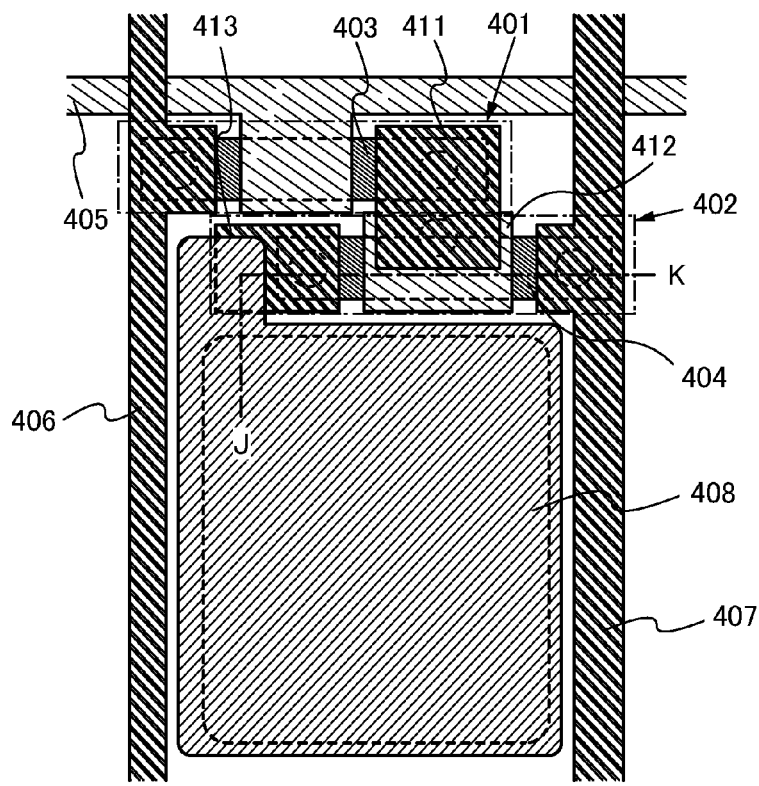
FIGS. 7A and 7B are diagrams illustrating an example of a display device using an SOI substrate.
Figure 7B:
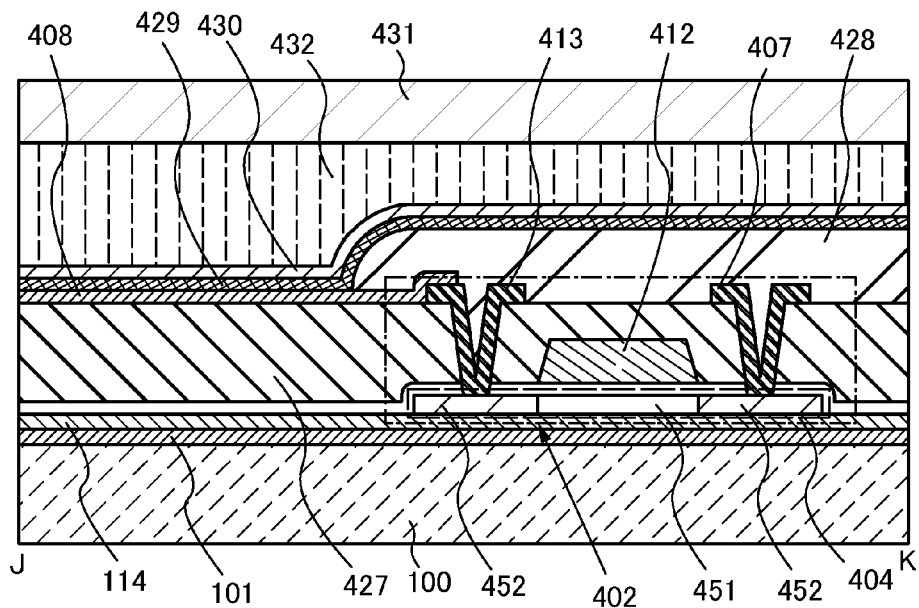

Next, an EL display device is described. FIG. 7A is a plan view of a pixel in an EL display device, and FIG. 7B is a cross-sectional view along a section line J-K in FIG. 7A. As illustrated in FIG. 7A, the pixel includes a selecting transistor 401 and a display control transistor 402, a scan line 405, a signal line 406, a current supply line 407, and a pixel electrode 408. Each pixel is provided with a light-emitting element having a structure in which a layer containing an electroluminescent material (an organic compound layer including at least a light-emitting layer) is sandwiched between a pair of electrodes. One of the electrodes of the light-emitting element is the pixel electrode 408.

Each of a semiconductor layer 403 included in the selecting transistor 401 and a semiconductor layer 404 included in the display control transistor 402 is a layer formed by etching the semiconductor layer 118 illustrated in FIG. 1E.

In the selecting transistor 401, a gate electrode is included in the scan line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 electrically connected to the pixel electrode 408, and the other thereof is included in the current supply line 407.

The display control transistor 402 is a p-channel field-effect transistor. As illustrated in FIG. 7B, in the semiconductor layer 404, a channel formation region 451 and a p-type impurity region 452 are formed. An interlayer insulating layer 427 is formed to cover the gate electrode 412 of the display control transistor 402. Over the interlayer insulating layer 427, the signal line 406, the current supply line 407, the electrode 413, and the like are formed. Further, over the interlayer insulating layer 427, the pixel electrode 408 electrically connected to the electrode 413 is formed. A peripheral portion of the pixel electrode 408 is surrounded by an insulating partition layer 428. An organic compound layer 429 is formed over the pixel electrode 408, and a counter electrode 430 is formed over the organic compound layer 429. A counter substrate 431 is provided as a reinforcing plate, and the counter substrate 431 is fixed to the base substrate 100 with a resin layer 432.

As the base substrate 100, a glass substrate can be used. Therefore, the structure of an EL display device manufactured using the SOI substrate according to an embodiment of the present invention is not limited to a top emission structure in which light is extracted from a counter substrate side, and can be a bottom emission structure in which light is extracted from a base substrate side.

The transistor using the semiconductor layer in the SOI substrate according to an embodiment of the present invention can be applied to the liquid crystal display device illustrated in FIGS. 6A and 6B and the EL display device illustrated in FIGS. 7A and 7B. The semiconductor layer according to an embodiment of the present invention is formed using a single crystal semiconductor and therefore has a higher crystallinity than a polycrystalline semiconductor layer obtained by laser crystallization of a conventional amorphous semiconductor layer. When a channel formation region of a transistor is formed using a semiconductor layer with a high crystallinity, higher performance of a transistor, which, for example, drives a pixel included in a display device, can be achieved, and further, a high-definition display device can be provided.

Further, since a glass substrate can be used as the base substrate as described above, the base substrate can transmit light, which is different from the case of using a semiconductor substrate as the base substrate. Therefore, the structure can be selected as appropriate among a structure in which light is extracted from the base substrate side (a structure in which the base substrate transmits light), a structure in which light is extracted from the counter substrate side (a structure in which the counter substrate transmits light), a structure in which light is extracted from both substrates (a structure in which both substrates transmit light), and the like.

This embodiment can be implemented in appropriate combination with the structures described in the other embodiments.

Embodiment 5

In this embodiment, electronic appliances each provided with a display device which is an embodiment of the present invention for a display portion are described.

Examples of a structure of an electronic appliance of this embodiment are described with reference to FIGS. 8A and 8B, FIGS. 9A and 9B, and FIGS. 10A and 10B. FIGS. 8A and 8B, FIGS. 9A and 9B, and FIGS. 10A and 10B each illustrate an example of a structure of an electronic appliance of this embodiment.

A display device which is an embodiment of the present invention can be applied to a variety of electronic appliances (including game machines). Examples of electronic appliances are a television device (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like.

Figure 8A:
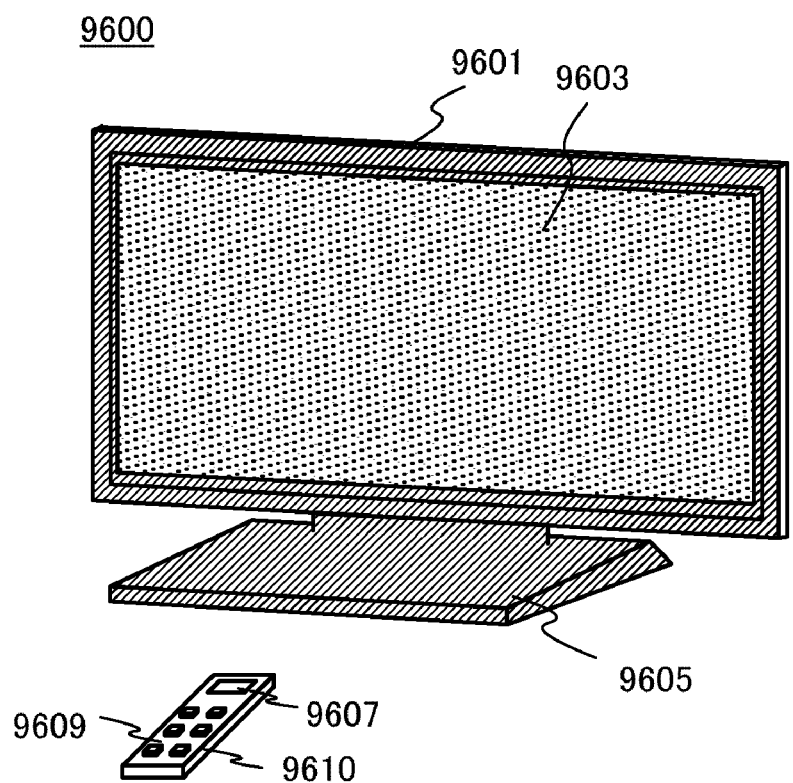
FIGS. 8A and 8B are diagrams each illustrating an example of a structure of an electronic appliance.

FIG. 8A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 8B:
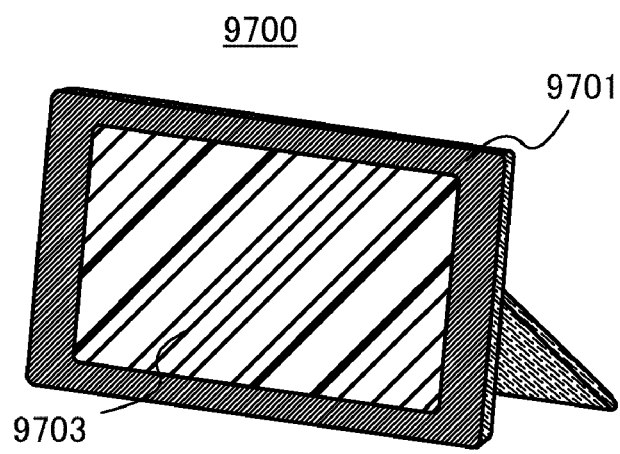

FIG. 8B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 9A:
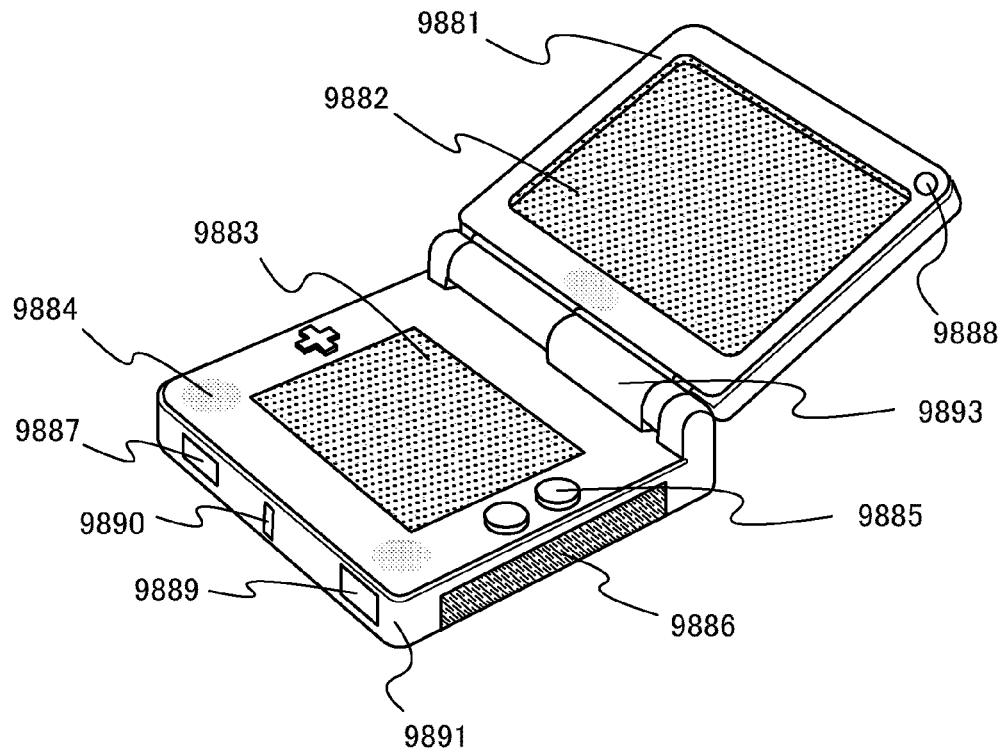
FIGS. 9A and 9B are diagrams each illustrating an example of a structure of an electronic appliance.

FIG. 9A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. Moreover, the portable game machine illustrated in FIG. 9A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine may have a structure in which additional accessory equipment is provided as appropriate as long as at least the display device according to an embodiment of the present invention is provided.

The portable game machine in FIG. 9A has a function of reading a program or data stored in a recording medium to display it on the display portion, and a function of sharing information with another portable game machine by wireless communication. Note that the function of the portable game machine illustrated in FIG. 9A is not limited to those described above, and the portable game machine can have a variety of functions.

Figure 9B:
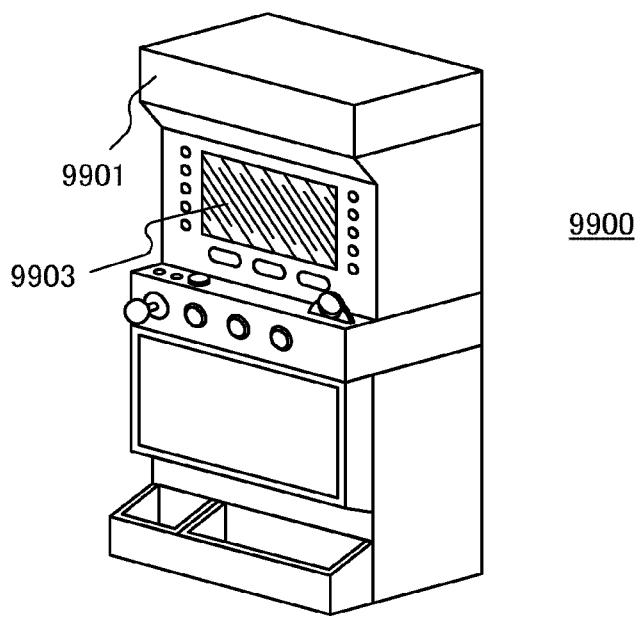

FIG. 9B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above structure. The slot machine may have a structure in which additional accessory equipment is provided as appropriate as long as at least the display device according to an embodiment of the present invention is provided.

Figure 10A:
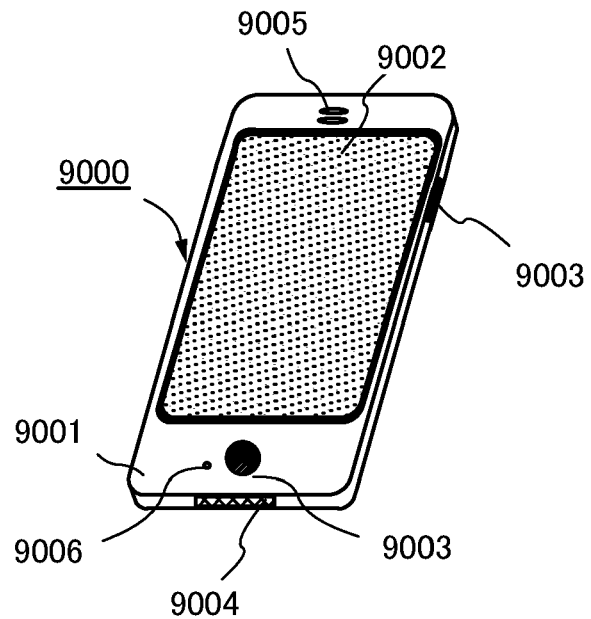
FIGS. 10A and 10B are diagrams each illustrating an example of a structure of an electronic appliance.

FIG. 10A illustrates an example of a mobile phone. A mobile phone 9000 is provided with a display portion 9002 incorporated into a housing 9001, an operation button 9003, an external connection port 9004, a speaker 9005, a microphone 9006, and the like.

When the display portion 9002 of the mobile phone 9000 illustrated in FIG. 10A is touched with a finger or the like, data can be input into the mobile phone 9000. Users can make a call or text messaging by touching the display portion 9002 with their fingers or the like.

There are mainly three screen modes of the display portion 9002. The first mode is a display mode mainly for displaying an image. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 9002 so that characters displayed on a screen can be input. In that case, it is preferable to display a keyboard or number buttons on almost all the area of the screen of the display portion 9002.

When a detection device including a sensor for detecting inclination, such as a gyroscope or an acceleration sensor, is provided inside the mobile phone 9000, display on the screen of the display portion 9002 can be automatically changed by determining the orientation of the mobile phone 9000 (whether the mobile phone 9000 stands upright or is laid down on its side).

The screen modes are changed by touching the display portion 9002 or using the operation buttons 9003 of the housing 9001. Alternatively, the screen modes may be changed depending on the kind of image displayed on the display portion 9002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 9002 is not performed for a certain period while a signal detected by an optical sensor in the display portion 9002 is detected, the screen mode may be controlled so as to be changed from the input mode to the display mode.

The display portion 9002 can also function as an image sensor. For example, an image of a palm print, a fingerprint, or the like is taken when the display portion 9002 is touched with a palm or a finger, whereby personal identification can be performed. Further, by providing a backlight or a sensing light source which emits near-infrared light in the display portion, an image of a finger vein, a palm vein, or the like can be taken.

Figure 10B:
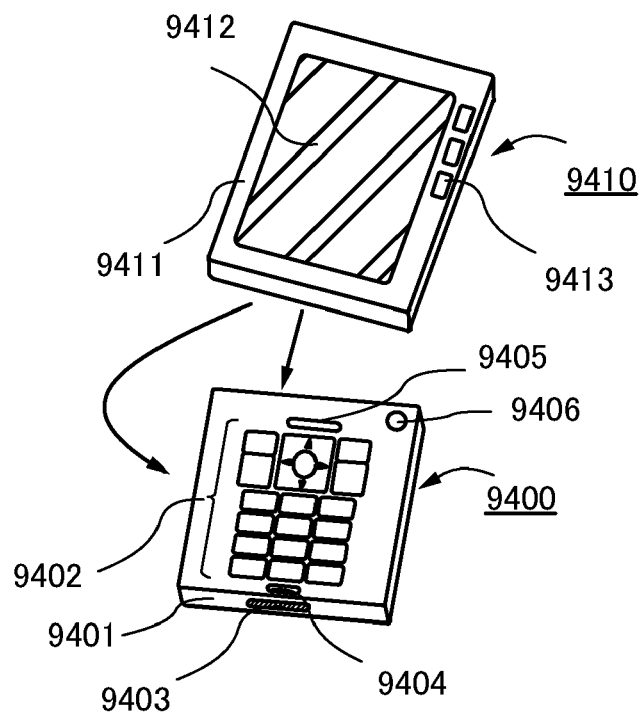

FIG. 10B also illustrates an example of a mobile phone. The mobile phone illustrated in FIG. 10B is provided with a display device 9410 having a display portion 9412 and operation buttons 9413 in a housing 9411 and a communication device 9400 having operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Accordingly, the display device 9410 and the communication device 9400 can be attached to each other along respective short axes or long axes. When only the display function is needed, the display device 9410 can be detached from the communication device 9400 and used alone. The communication device 9400 and the display device 9410 can transmit and receive images or input data to/from each other by wireless communication or wired communication, and each of the communication device 9400 and the display device 9410 has a rechargeable battery.

As described above as examples, the display device which is an embodiment of the present invention can be used for a variety of electronic appliances. Further, mounting of the display device which is an embodiment of the present invention can improve the reliability of an electronic appliance.

This embodiment can be implemented in appropriate combination with the structures described in the other embodiments.

This application is based on Japanese Patent Application serial no. 2010-084278 filed with Japan Patent Office on Mar. 31, 2010, the entire contents of which are hereby incorporated by reference.

What is claimed is:

1. A manufacturing method comprising the steps of:
    disposing a semiconductor layer in front of a semiconductor target; and
    irradiating the layer with a rare gas ion so as to planarize the layer,
    wherein the layer and the target are alternately irradiated with the rare gas ion.

2. The manufacturing method according to claim 1,
    wherein the layer and the target comprise a same semiconductor material.

3. The manufacturing method according to claim 1,
    wherein the layer is bonded to a substrate; and
    wherein the target has a same structure and is made of same materials as an assemblage of the layer and the substrate.

4. The manufacturing method according to claim 1, wherein the manufacturing method is for manufacturing an electronic appliance.

5. A method for manufacturing an SOI substrate, the method comprising the steps of:
    irradiating a semiconductor bond substrate with an accelerated ion so as to form an embrittlement region in the bond substrate;
    forming an electrically insulating layer on a surface of one of the bond substrate and a base substrate;
    bonding the bond substrate to the base substrate, the insulating layer being positioned between the bond substrate and the base substrate;
    splitting the bond substrate along the embrittlement region so as to leave a semiconductor layer bonded to the base substrate;
    disposing the base substrate in front of a target, the semiconductor layer being positioned between the base substrate and the target; and
    irradiating alternately the semiconductor layer and the target with a rare gas ion so as to planarize the semiconductor layer.

6. The method for manufacturing an SOI substrate according to claim 5,
    wherein the semiconductor layer and the target comprise a same semiconductor material.

7. The method for manufacturing an SOI substrate according to claim 5,
    wherein the target is a semiconductor target.

8. The method for manufacturing an SOI substrate according to claim 5,
    wherein the target has a same structure and is made of same materials as an assemblage of the semiconductor layer and the base substrate.

9. A method for reprocessing a semiconductor bond substrate, the method comprising the steps of:
    irradiating the semiconductor bond substrate with an accelerated ion so as to form an embrittlement region in the bond substrate;
    splitting the bond substrate along the embrittlement region;
    disposing, after splitting, the bond substrate in front of a target; and
    irradiating alternately the bond substrate and the target with a rare gas ion so as to planarize a surface of the bond substrate.

10. The method for reprocessing a semiconductor bond substrate according to claim 9, wherein the bond substrate and the target comprise a same semiconductor material.

11. The method for reprocessing a semiconductor bond substrate according to claim 9,
wherein the target is a semiconductor target.

12. The method for reprocessing a semiconductor bond substrate according to claim 9,
wherein the target has a same structure and is made of same materials as the bond substrate.

13. A method for manufacturing an SOI substrate comprising the steps of:
irradiating a bond substrate with an accelerated ion, so that an embrittlement region is formed in the bond substrate;
forming an insulating layer over a surface of the bond substrate or a surface of a base substrate;
bonding the bond substrate and the base substrate with the insulating layer positioned therebetween;
splitting the bond substrate at the embrittlement region by a heat treatment, so that a semiconductor layer is formed over the base substrate;
disposing the semiconductor layer provided over the base substrate and a semiconductor target containing the same semiconductor material as the semiconductor layer so that a surface of the semiconductor layer provided over the base substrate and the semiconductor target face each other; and
alternately irradiating the surface of the semiconductor layer and the semiconductor target with a rare gas ion, so that the surface of the semiconductor layer is planarized.

14. The method for manufacturing the SOI substrate according to claim 13,
wherein the semiconductor target is a bond substrate after a split.

15. A method for manufacturing an SOI substrate comprising the steps of:
irradiating a bond substrate with an accelerated ion, so that an embrittlement region is formed in the bond substrate;
forming an insulating layer over a surface of the bond substrate or a surface of a base substrate;
bonding the bond substrate and the base substrate with the insulating layer positioned therebetween;
splitting the bond substrate at the embrittlement region by a heat treatment, so that a semiconductor layer is formed over the base substrate;
disposing the semiconductor layer provided over the base substrate and a semiconductor layer provided over another base substrate of the same structure so that a surface of the semiconductor layer provided over the base substrate and a surface of the semiconductor layer provided over the another base substrate face each other; and
alternately irradiating the surface of the semiconductor layer and the surface of the semiconductor layer provided over the another base substrate with a rare gas ion, so that the surfaces of the semiconductor layers are planarized.

16. A method for reprocessing a bond substrate comprising the steps of:
irradiating a bond substrate with an accelerated ion, so that an embrittlement region is formed in the bond substrate;
forming an insulating layer over a surface of the bond substrate or a surface of a base substrate;
bonding the bond substrate and the base substrate with the insulating layer positioned therebetween;
splitting the bond substrate at the embrittlement region by a heat treatment, so that a semiconductor layer is formed over the base substrate;
disposing the bond substrate after the split and a semiconductor target containing the same semiconductor material as the bond substrate so that a surface of the bond substrate after the split and the semiconductor target face each other; and
alternately irradiating the surface of the bond substrate and the semiconductor target with a rare gas ion, so that the surface of the bond substrate is planarized.

* * * * *